(12) United States Patent
Gk et al.

(10) Patent No.: US 7,388,419 B2
(45) Date of Patent: Jun. 17, 2008

(54) PVT VARIATION DETECTION AND COMPENSATION CIRCUIT

(75) Inventors: Siddhartha Gk, New Delhi (IN);
Qadeer A. Khan, New Delhi (IN);
Divya Tripathi, Bhopal (IN); Sanjay K Wadhwa, Uttar Pradesh (IN);
Kulbhushan Misri, Haryana (IN)

(73) Assignee: Freescale Semiconductor, Inc, Austin, TX (US)

( * ) Notice: Subject to any disclaimer, the term of this patent is extended or adjusted under 35 U.S.C. 154(b) by 16 days.

(21) Appl. No.: 11/490,439

(22) Filed: Jul. 20, 2006

(65) Prior Publication Data

US 2007/0018712 A1    Jan. 25, 2007

(30) Foreign Application Priority Data

Jul. 22, 2005   (IN)   ........................ 1926/DEL/2005

(51) Int. Cl.
*H01L 35/00* (2006.01)
*H01L 37/00* (2006.01)
*H03K 3/42* (2006.01)
*H03K 17/78* (2006.01)

(52) U.S. Cl. ...................................... 327/513; 327/512

(58) Field of Classification Search ................. 327/512, 327/513
See application file for complete search history.

(56) References Cited

U.S. PATENT DOCUMENTS

| | | | |
|---|---|---|---|
| 5,498,977 | A | 3/1996 | Pickup |
| 5,892,409 | A | 4/1999 | Boerstler |
| 6,218,886 | B1 | 4/2001 | Balistreri et al. |
| 6,417,727 | B1 | 7/2002 | Davis |
| 6,486,699 | B1 | 11/2002 | Friebe et al. |
| 6,504,420 | B1 * | 1/2003 | Vorenkamp et al. ......... 327/513 |
| 6,653,890 | B2 | 11/2003 | Ono et al. |
| 6,822,504 | B2 | 11/2004 | Morikawa |
| 6,844,755 | B2 | 1/2005 | Ajit |
| 2005/0134364 | A1 | 6/2005 | Bhattacharya et al. |

* cited by examiner

*Primary Examiner*—Tuan T. Lam
*Assistant Examiner*—Daniel Rojas
(74) *Attorney, Agent, or Firm*—Charles Bergere

(57) ABSTRACT

A compensation circuit and a method for compensating for process, voltage and temperature (PVT) variations in an integrated circuit (IC). The IC includes several functional modules, each of which includes a set of functional units, and generates an output signal in response to an input signal. The compensation circuit includes a code generator and a logic module. The code generator generates a digital code for each functional unit. The digital codes are based on phase differences between the input signal and the output signal. The logic module generates calibration codes based on the digital codes. The calibration codes compensate for the PVT variations in the corresponding functional units.

13 Claims, 5 Drawing Sheets

PVT VARIATION DETECTION AND COMPENSATION CIRCUIT

BACKGROUND OF THE INVENTION

The present invention relates generally to the field of integrated circuits (ICs) and, in particular, to process, voltage and temperature (PVT) variations in ICs.

PVT variations are a critical factor that can hamper the performance of the ICs. For example, PVT variations can result in a change in setup and hold times of synchronous circuits. Different components of a synchronous circuit are driven by a common system clock. Therefore, a change in the setup or hold times corresponding to any one component can result in an erroneous circuit output. PVT variations can also result in a change in slew rates, increase in current leakage, and electromagnetic interference (EMI).

One technique for reducing PVT variations in a circuit is based on sensing variations in the operation of the circuit and taking appropriate action to reduce these variations. For example, if a variation in the signal delay is identified, then the input signal delay is changed accordingly to compensate for the variation. In other cases, delay variations in the circuit are monitored and bias voltages of P-metal oxide semiconductor (PMOS) and N-metal oxide semiconductor (NMOS) transistors of the circuit are changed depending on the delay variations.

Another technique to compensate for PVT variations of the circuit is based on open loop control. The circuit output is determined by a control value and the circuit output is compensated by regulating the control value so that it corresponds to typical input-output characteristics of the circuit.

Some of the techniques mentioned above provide the same compensation for PVT variations of both the PMOS and the NMOS transistors. However, PVT variations associated with the PMOS and the NMOS transistors may be quite different. Therefore, such techniques might not provide adequate compensation. Further, a memory is required to compensate for PVT variations. Finally, these techniques involve additional process steps, which are complex in nature.

BRIEF DESCRIPTION OF THE DRAWINGS

The following detailed description of preferred embodiments of the present invention will be better understood when read in conjunction with the appended drawings. The present invention is illustrated by way of example and not limited by the accompanying figures, in which like references indicate similar elements.

DETAILED DESCRIPTION OF THE PRESENT INVENTION

Figure 1:
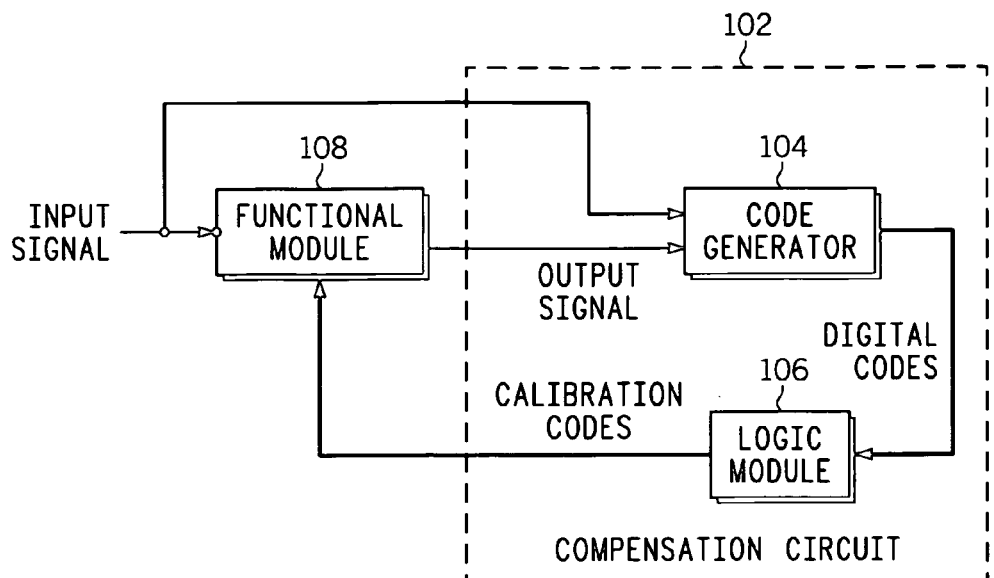
FIG. 1 is a schematic block diagram of a compensation circuit in accordance with an embodiment of the present invention.

The detailed description in connection with the appended drawings is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention provides a compensation circuit for compensating for PVT variations in an integrated circuit. The integrated circuit includes a plurality of functional modules, each of which includes a set of functional units, and generates an output signal in response to an input signal. The compensation circuit includes a code generator and a logic module. The code generator generates a digital code for each functional unit from amongst the set of functional units. The digital codes are based on phase differences between the input signals and the output signals. The logic module is coupled to the code generator and generates calibration codes based on the digital codes. Further, the calibration codes compensate for the PVT variations in the corresponding functional units.

In another embodiment of the present invention, a compensation circuit that compensates for PVT variations in an integrated circuit is provided. The integrated circuit includes a plurality of functional modules, each of which includes a set of functional units, and generates an output signal in response to an input signal. The compensation circuit includes a phase difference detector, an averaging module, at least one comparator, a code comparator, and a shift register. The phase difference detector generates a phase signal based on a phase difference between the input signal and the output signal. The averaging module is coupled to the phase difference detector, and averages the phase signal to generate a phase error signal. At least one comparator is coupled to the averaging module, and generates a digital code for each functional unit. The digital code is generated by comparing the phase error signal with at least one reference signal. The code comparator is coupled to the at least one comparator, and compares the digital code with a reference code to generate a control signal. The shift register is coupled to the code comparator and generates a calibration code based on the control signal. The calibration code compensates for the PVT variations in the corresponding functional unit.

In another embodiment of the present invention, a method for compensating for PVT variations in an integrated circuit is provided. The integrated circuit includes a plurality of functional modules, each of which includes a set of functional units, and generates an output signal in response to an input signal. The method includes generating a digital code for each functional unit from amongst the set of functional units, generating respective calibration codes, and compensating for the PVT variations by providing the respective calibration codes to the corresponding functional units. The digital codes are based on phase differences between the input signal and the output signal. The respective calibration codes are generated based on the digital codes and reference codes.

In one embodiment of the present invention, the compensation circuit is implemented in an integrated circuit (IC). The compensation circuit is suitable for detecting voltage and temperature variations, and variations in process corners at which the IC is fabricated. The process corners indicate the performance metrics of devices in the IC in terms of timing behavior. The devices include NMOS and PMOS transistors. The compensation circuit detects, and compensates for PVT variations when both the NMOS and the PMOS transistors of a device correspond to a best case, worst case, or a typical case timing scenario.

The compensation circuit also detects and compensates for the PVT variations in case of skewed corners, for example, when the NMOS transistors correspond to the best case, and the PMOS transistors correspond to the worst case, or vice versa. In other words, the PVT variations can be detected for the NMOS transistors and the PMOS transistors in the device, when, for example, the NMOS transistors are fast and the PMOS transistors are slow. The variations are then independently compensated for in the NMOS and the PMOS transistors. The compensation circuit provides real-time compensation, and therefore does not require memory or storage space. Further, the compensation process does not require complex fabrication steps, and is a cost-effective solution.

Referring now to FIG. 1, a compensation circuit 102 in accordance with an embodiment of the present invention is shown. The compensation circuit 102 includes a code generator 104 and a logic module 106. The compensation circuit 102 compensates for the PVT variations in a functional module 108. The functional module 108 includes multiple functional units. For the sake of simplicity, only one functional module is shown in FIG. 1. However, the number of the functional modules may be higher, depending on the performance requirements of the IC. The functional modules may be analog, combinational, or sequential logic circuits. In various embodiments of the present invention, the functional modules are devices such as I/O drivers, ring oscillators, delay lines, universal serial bus transmitters, serial advanced technology attachment transmitters, and low voltage differential signaling transmitters.

The code generator 104 generates digital codes based on a phase difference between the input signal and the output signal. The logic module 106 generates calibration codes based on the digital codes and reference codes. The calibration codes are provided to the functional module 108 to compensate for the PVT variations.

Figure 2:
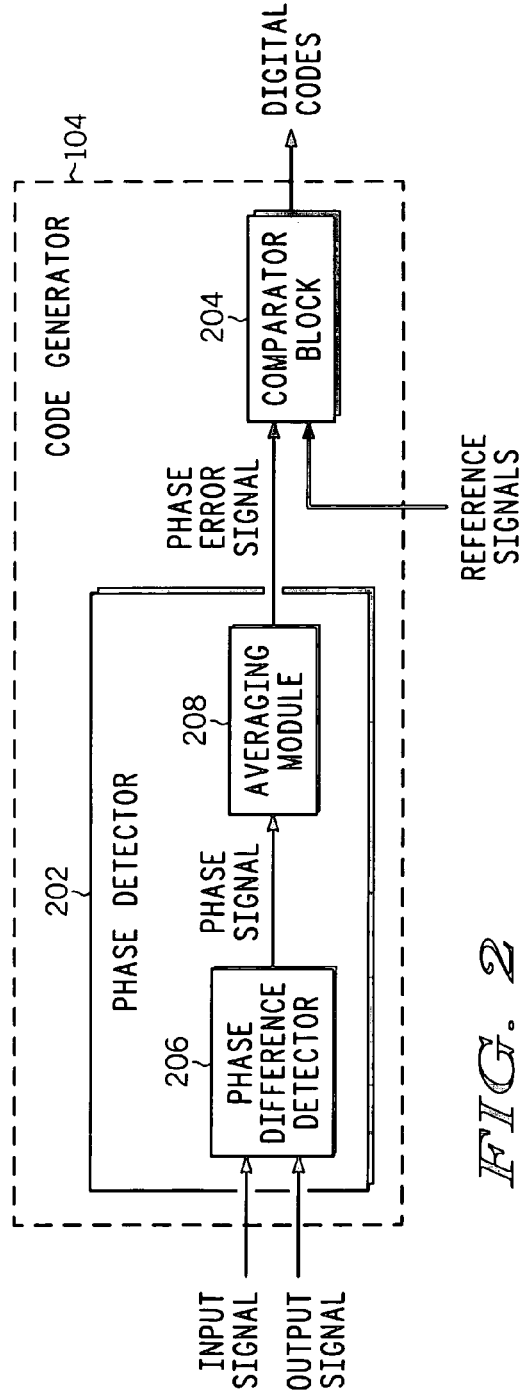
FIG. 2 is a schematic block diagram of a code generator in accordance with an embodiment of the present invention.

FIG. 2 is a schematic block diagram of the code generator 104 in accordance with an embodiment of the present invention. The code generator 104 includes a phase detector 202 and a comparator block 204. The phase detector 202 includes a phase difference detector 206 and an averaging module 208. The phase difference detector 206 receives the input signal and the output signal as inputs, and outputs a phase signal. The value of the phase signal depends on the phase difference between the input signal and the output signal.

Figure 3:
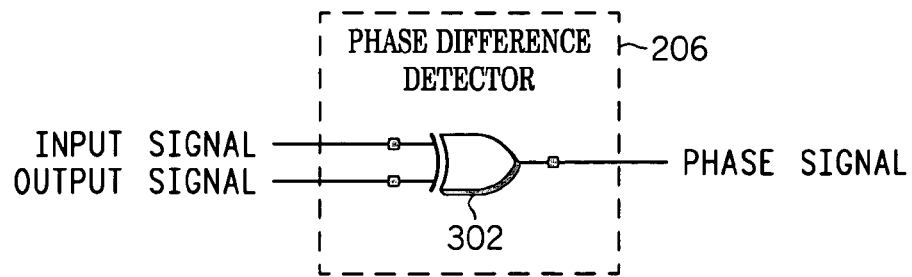
FIG. 3 is a schematic diagram of an exclusive-OR gate for detecting PVT variations in accordance with an exemplary embodiment of the present invention.

In an exemplary embodiment of the present invention, the phase difference detector 206 is an exclusive-OR (XOR) gate 302. FIG. 3 shows the XOR gate 302 for detecting the phase difference between the input signal and the output signal. The XOR gate 302 outputs the phase signal. The phase signal is a 'HIGH' when there is a difference between the phases of the input signal and the output signal.

Figure 4:
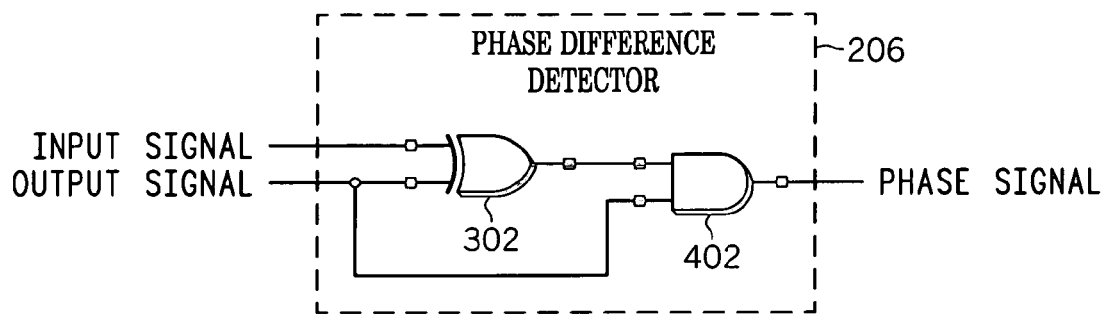
FIG. 4 is a schematic diagram of a phase difference detector for detecting PVT variations of NMOS transistors in accordance with an exemplary embodiment of the present invention.
Figure 5:
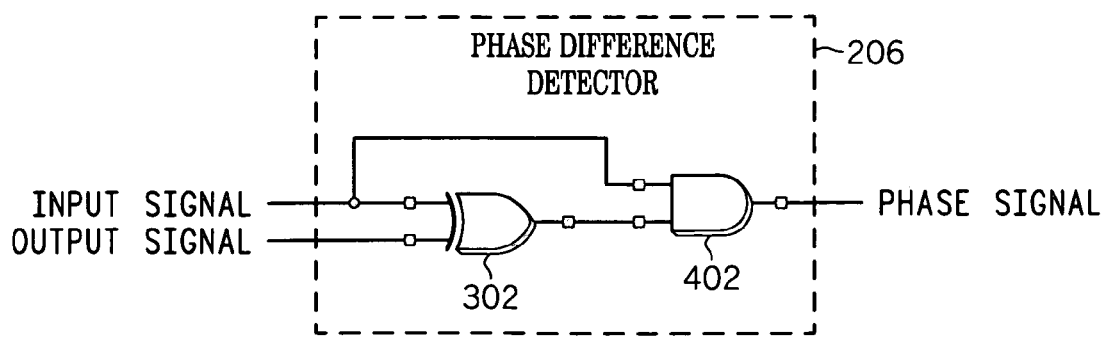
FIG. 5 is a schematic diagram of a phase difference detector for detecting PVT variations of PMOS transistors in accordance with an exemplary embodiment of the present invention.

In another exemplary embodiment of the present invention, the phase difference detector 206 independently detects the PVT variations of the NMOS and PMOS transistors in each functional unit of the functional module 108 by exemplary logic circuits, as shown in FIG. 4 and FIG. 5. FIG. 4 shows the phase difference detector 206 for detecting the PVT variations of the NMOS transistors of the functional module 108 in accordance with the exemplary embodiment of the present invention. The phase difference detector 206 includes the XOR gate 302 and an AND logic gate 402. The AND logic gate 402 receives the output of the XOR gate 302 and the output signal as inputs to generate the phase signal. The XOR gate 302 detects the phase difference between the input signal and the output signal. The phase signal edges corresponding to the rising edges of the input signal are passed on at the output of the AND logic gate 402 as the phase signal.

FIG. 5 shows the phase difference detector 206 for detecting the PVT variations of the PMOS transistors of the functional module 108 in accordance with the exemplary embodiment of the present invention. The phase difference detector 206 includes the XOR gate 302 and the AND logic gate 402. The AND logic gate 402 receives the output of the XOR gate 302 and the input signal as inputs to generate the phase signal. The XOR gate 302 detects the phase difference between the input signal and the output signal. The phase signal edges corresponding to the falling edges of the input signal are passed on at the output of the AND logic gate 402 as the phase signal.

Referring again to FIG. 2, the averaging module 208 averages the phase signal. The averaged phase signal is referred to as a phase error signal. In an embodiment of the present invention, the averaging module 208 is a low pass filter. The comparator block 204 receives the phase error signal and reference signals to generate the digital codes. The comparator block 204 is described later in conjunction with FIG. 7. The reference signals are generated by a reference module 602.

Figure 6:
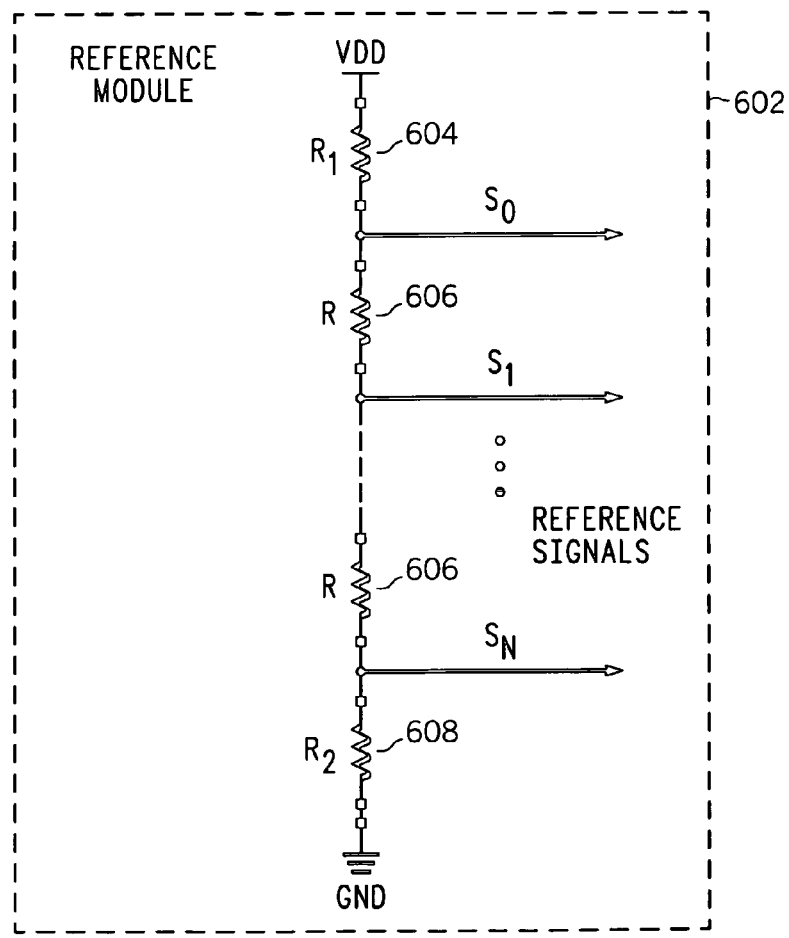
FIG. 6 is a schematic circuit diagram of a reference module in accordance with an exemplary embodiment of the present invention.

FIG. 6 is a schematic circuit diagram of the reference module 602 in accordance with an exemplary embodiment of the present invention. In this embodiment, the reference module 602 is a voltage divider circuit. The reference module 602 is coupled to the comparator block 204 (FIG. 2) and provides the references signals to the comparator block 204. The reference module 602 includes a series of resistances between a supply voltage 'VDD' and ground. However, there can be variations in VDD. In an embodiment of the present invention, the variations in VDD are detected using a band-gap reference voltage. The reference signals ($S_0, S_1, \ldots, S_N$) are obtained across resistances, as shown in FIG. 6. The number of the reference signals is equal to the number of functional units in the functional module 108.

Figure 7:
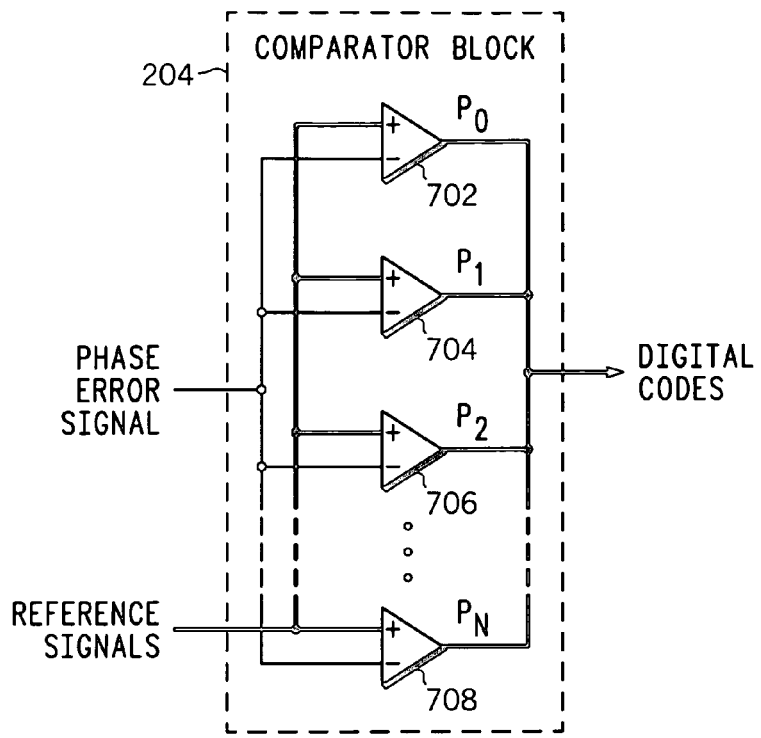
FIG. 7 is a schematic diagram of a comparator block, in accordance with an embodiment of the present invention.

The reference signals ($S_0, S_1, \ldots, S_N$) and the phase error signal are provided to the comparator block 204. FIG. 7 is a schematic diagram of the comparator block 204 in accordance with an embodiment of the present invention. The comparator block 204 includes comparators 702, 704, 706, and 708. The comparator block 204 compares the phase error signal with the reference signals ($S_0, S_1, \ldots, S_N$) to generate the digital codes ($P_0, P_1, \ldots, P_N$). For this purpose, each comparator 702-708 in the comparator block 204 compares the phase error signal with a particular reference signal. For example, the comparator 702 compares the reference signal $S_0$ with the phase error signal. If $S_0$ is greater than the phase error signal, then the value of the digital code $P_0$ is HIGH. However, if $S_0$ is less than the phase error signal, then the value of $P_0$ is LOW. Similarly, other values of the digital codes ($P_0, P_1, \ldots, P_N$) are generated by comparing the phase error signal with the corresponding reference signals.

Figure 8:
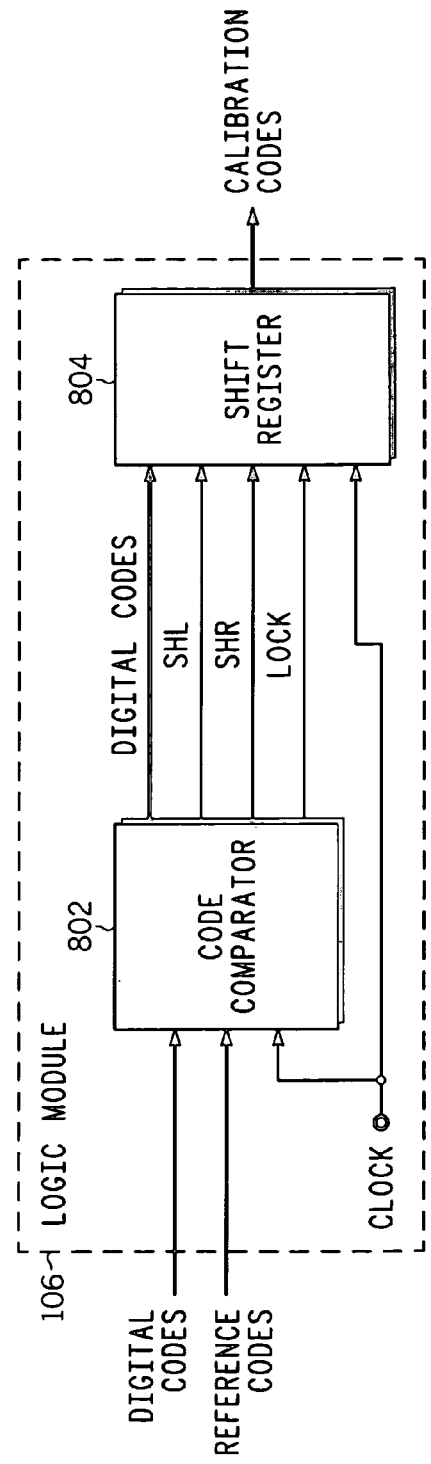
FIG. 8 is a schematic block diagram of a logic module, in accordance with an embodiment of the present invention.

The digital codes ($P_0, P_1, \ldots, P_N$) are provided to the logic module 106 to generate the calibration codes. FIG. 8 is a schematic block diagram of the logic module 106 in accordance with an embodiment of the present invention. The logic module 106 includes a code comparator 802 and a shift register 804. The code comparator 802 receives the digital codes ($P_0, P_1, \ldots, P_N$) and the reference codes ($R_0, R_1, \ldots, R_N$) and generates control signals. The reference codes ($R_0, R_1, \ldots, R_N$) represent the codes corresponding to typical process corners for the functional module 108. The control signals that are generated are 'shl', 'shr' and 'lock'. The code comparator 802 and the shift register 804 are synchronized by a clock. At reset, no compensation is carried out by the compensation circuit 102, and therefore the reference codes ($R_0, R_1, \ldots, R_N$) are equal to the digital codes ($P_0, P_1, \ldots, P_N$). At the first positive edge of the clock pulse, the digital codes ($P_0, P_1, \ldots, P_N$) are compared with the reference codes ($R_0, R_1, \ldots, R_N$) to generate the control signals.

If the value of a digital code is less than the value of a reference code, the control signal shl is generated. In other words, the value of the control signal shl becomes HIGH. If the value of the digital code is greater than the value of the reference code, the control signal shr is generated. In other words, the value of the control signal shr becomes HIGH. If the value of the digital code is equal to the value of the reference code, the control signal lock is generated, that is the value of the control signal lock becomes HIGH. Further, the calibration codes ($C_0, C_1, \ldots, C_N$) are generated from the digital codes ($P_0, P_1, \ldots, P_N$) based on the control signals. A digital code is shifted left by the shift register 804 when the control signal is shl, shifted right by the shift register 804 when the control signal is shr, and is latched by the shift register 804 when the control signal is lock. For example, if the value of the digital code $P_0$ is less than the reference code $R_0$ at any point in time, the control signal shl is generated. Therefore, $P_0$ is shifted left by the shift register 804 to generate the calibration code $C_0$. The other calibration codes are generated in a similar manner.

Figure 9:
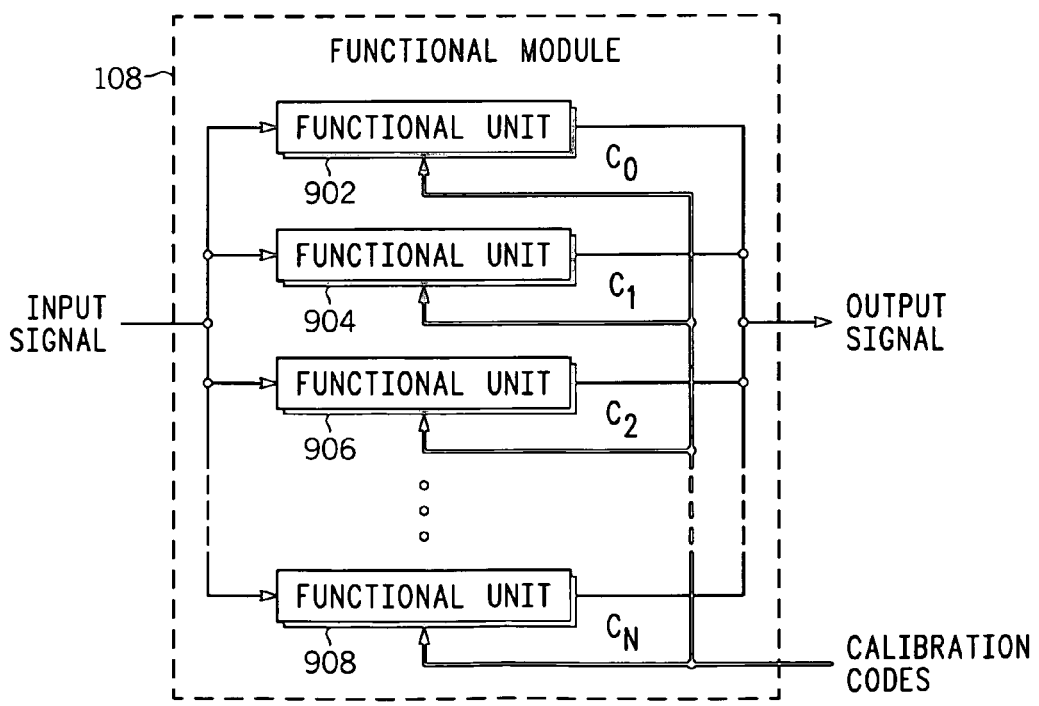
FIG. 9 is a schematic block diagram of a functional module in accordance with an embodiment of the present invention.

The calibration codes ($C_0, C_1, \ldots, C_N$) are provided as inputs to the corresponding functional units of the functional module 108 to compensate for their PVT variations. FIG. 9 is a schematic block diagram of the functional module 108 in accordance with an embodiment of the present invention. The functional module 108 includes functional units 902, 904, 906, and 908. The functional units 902-908 are provided the corresponding calibration codes ($C_0, C_1, \ldots, C_N$). For example, the functional unit 902 is provided the calibration code $C_0$. Similarly, the functional unit 908 is provided the calibration code $C_N$. In this way, any variations in the output signal caused by the PVT variations are compensated. The output signal is again compared with the input signal to generate subsequent calibration codes. The process is repeated for the purpose of compensation. In other words, the compensation circuit 102 provides a closed loop control to compensate for the PVT variations in the output signal.

Figure 10:
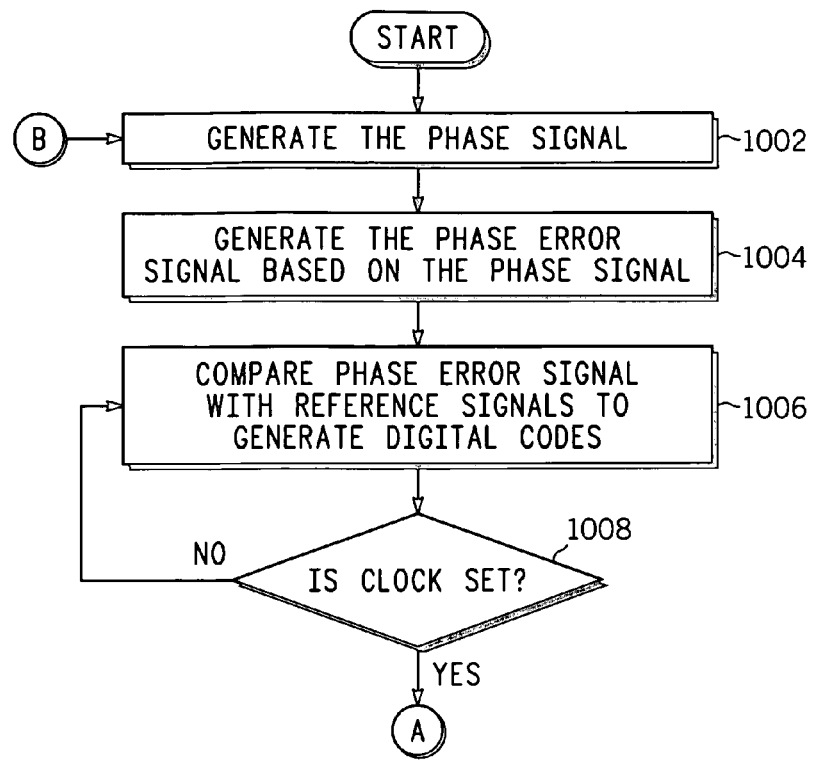
FIGS. 10 and 11 are flowcharts depicting a method for compensating for PVT variations in an integrated circuit in accordance with an embodiment of the present invention.
Figure 11:
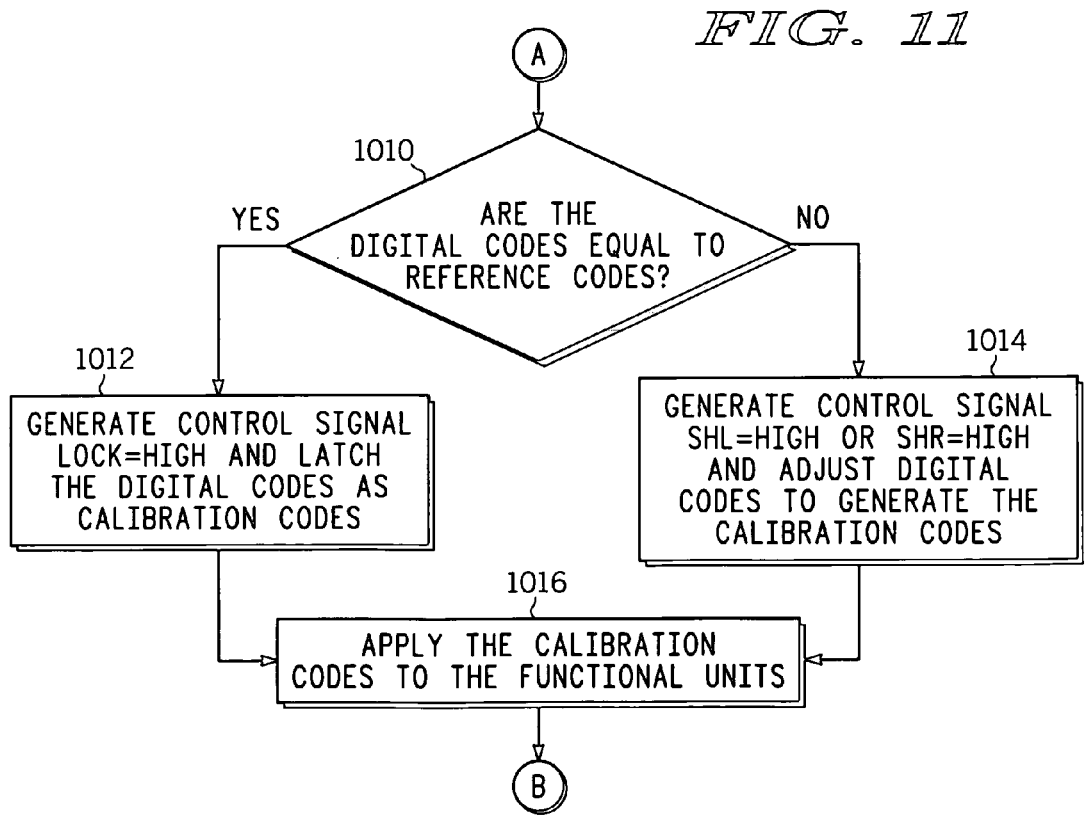

FIG. 10 and FIG. 11 are a flowchart depicting a method for compensating for the PVT variations in the IC in accordance with an embodiment of the present invention. Referring now to FIG. 10, at step 1002, a phase signal is generated based on the phase difference between the input and output signal. At step 1004, the phase signal is averaged to generate the phase error signal. At step 1006, the phase error signal is compared with the reference signals ($S_0, S_1, \ldots, S_N$) to generate the digital codes ($P_0, P_1, \ldots, P_N$).

At step 1008, the clock is checked. If the clock is reset, no compensation is carried out by the compensation circuit 102 and the comparison process of step 1006 is continued till the clock is set at step 1008. Referring now to FIG. 11, step 1010 is performed if the clock is set. At step 1010, the digital codes ($P_0, P_1, \ldots, P_N$) are compared with the reference codes ($R_0, R_1, \ldots, R_N$) at the positive edge of the clock pulse. In case the value of a digital code is found to be equal to the value of the corresponding reference code as described earlier, the control signal lock is generated at step 1012. In this case, the digital code is latched as the calibration code.

However, if the value of the digital code is not equal to the value of the reference code, the digital code is adjusted to generate the calibration code at step 1014. If the value of the digital code is less than the value of the reference code, then the control signal shl is generated. The digital code is then shifted left to generate the calibration code. If the value of the digital code is greater than the value of the reference code, the control signal shr is generated. The digital code is then shifted right to generate the calibration code. In this way, the calibration codes ($C_0, C_1, \ldots, C_N$) are generated. At step 1016, the calibration codes ($C_0, C_1, \ldots, C_N$) are provided to the corresponding functional units 902-908. The steps 1002-1016 are repeated for providing the closed loop control for compensating for the PVT variations of the functional module 108.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A compensation circuit for compensating for process, voltage and temperature (PVT) variations in an integrated circuit, the integrated circuit including a plurality of functional modules, each functional module including a set of functional units, and generating an output signal in response to an input signal, the compensation circuit comprising:

a code generator for generating a digital code for each functional unit from amongst the set of functional units, wherein the digital codes are based on phase differences between the input signals and the output signals; and a code comparator for comparing the digital code with a reference code to generate at least one control signal; and a shift register coupled to the code comparator for generating a calibration code based on the at least one control signal, wherein the calibration code compensates for the PVT variations in the corresponding functional units, wherein generating the calibration code comprises shifting the digital code left to generate the calibration code when the digital code is less than the reference code, and shifting the digital code right to generate the calibration code when the digital code is greater than the reference code.

2. The compensation circuit of claim 1, wherein the code generator comprises:

a phase detector for generating a phase error signal based on the phase difference between the input signal and the output signal; and at least one comparator coupled to the phase detector for generating the digital code by comparing the phase error signal with at least one reference signal.

3. The compensation circuit of claim 2, wherein the phase detector comprises:
   a phase difference detector for generating a phase signal based on the phase difference between the input signal and the output signal; and
   an averaging module coupled to the phase difference detector for averaging the phase signal to generate the phase error signal.

4. The compensation circuit of claim 3, wherein the phase difference detector independently detects the phase difference for N-Metal Oxide Semiconductor (NMOS) transistors and P-Metal Oxide Semiconductor (PMOS) transistors in each functional unit from amongst the set of functional units.

5. The compensation circuit of claim 3, wherein the averaging module is a low pass filter.

6. The compensation circuit of claim 1, wherein the digital code is latched as the calibration code when the digital code equals the reference code.

7. A compensation circuit that compensates for process, voltage and temperature (PVT) variations in an integrated circuit, the integrated circuit including a plurality of functional modules, each functional module including a set of functional units, and generating an output signal in response to an input signal, the compensation circuit comprising:
   a phase difference detector for generating a phase signal based on a phase difference between the input signal and the output signal;
   an averaging module coupled to the phase difference detector for averaging the phase signal to generate a phase error signal;
   at least one comparator coupled to the averaging module for generating a digital code for each functional unit from amongst the set of functional units by comparing the phase error signal with at least one reference signal;
   a code comparator coupled to the at least one comparator for comparing the digital code with a reference code to generate a control signal; and
   a shift register coupled to the code comparator for generating a calibration code based on the control signal,
   wherein generating the calibration code comprises shifting the digital code left when the digital code is less than the reference code, and shifting the digital code right when the digital code is greater than the reference code, and
   wherein the calibration code compensates for the PVT variations in the corresponding functional unit.

8. The compensation circuit of claim 7, wherein the phase difference detector independently detects the phase difference for N-Metal Oxide Semiconductor (NMOS) transistors and P-Metal Oxide Semiconductor (PMOS) transistors in each functional unit from amongst the set of functional units.

9. The compensation circuit of claim 7, wherein the digital code is latched as the calibration code when the digital code equals the reference code.

10. A method for compensating for process, voltage and temperature (PVT) variations in an integrated circuit, the integrated circuit including a plurality of functional modules, each functional module including a set of functional units, and generating an output signal in response to an input signal, the method comprising:
    generating a digital code for each functional unit from amongst the set of functional units, wherein the digital codes are based on a phase difference between the input signal and the output signal;
    generating respective calibration codes based on the digital codes and reference codes, wherein generating the calibration code comprises shifting the digital code left to generate the calibration code when the digital code is less than the reference code, shifting the digital code right to generate the calibration code when the digital code is greater than the reference code, and latching the digital code as the calibration code when the digital code equals the reference code; and
    compensating for the PVT variations by providing the calibration code to the corresponding functional unit.

11. The PVT compensation method of claim 10, wherein generating the digital code comprises:
    generating a phase error signal based on the phase difference; and
    comparing the phase error signal with at least one reference signal to generate the digital code.

12. The PVT compensation method of claim 11, wherein generating the phase error signal comprises averaging a phase signal that is based on the phase difference.

13. The PVT compensation method of claim 12, wherein the phase signal is generated independently for N-Metal Oxide Semiconductor (NMOS) transistors and P-Metal Oxide Semiconductor (PMOS) transistors in each functional unit from amongst the set of functional units.

* * * * *